US012096584B2

(12) United States Patent
Lin

(10) Patent No.: US 12,096,584 B2
(45) Date of Patent: Sep. 17, 2024

(54) PLUG-IN HOLDER, PLUG-IN MODULE AND ELECTRONIC DEVICE

(71) Applicant: Wistron Corporation, New Taipei (TW)

(72) Inventor: Chih-Shen Lin, New Taipei (TW)

(73) Assignee: Wistron Corporation, New Taipei (TW)

( * ) Notice: Subject to any disclaimer, the term of this patent is extended or adjusted under 35 U.S.C. 154(b) by 4 days.

(21) Appl. No.: 17/717,123

(22) Filed: Apr. 10, 2022

(65) Prior Publication Data

US 2023/0199995 A1    Jun. 22, 2023

(30) Foreign Application Priority Data

Dec. 21, 2021   (TW) .................................. 110215178

(51) Int. Cl.
*H05K 7/14* (2006.01)
*G06F 1/18* (2006.01)
*H05K 7/12* (2006.01)

(52) U.S. Cl.
CPC ........... *H05K 7/1417* (2013.01); *G06F 1/185* (2013.01); *H05K 7/12* (2013.01)

(58) Field of Classification Search
CPC ........ H05K 7/1417; H05K 7/12; G06F 1/185; H01R 13/639
See application file for complete search history.

(56) References Cited

U.S. PATENT DOCUMENTS 5,329,424 A * 7/1994 Patel ...................... H05K 3/301
361/748
2022/0272858 A1* 8/2022 Lee ....................... H05K 7/1408
2022/0374057 A1* 11/2022 Lu ........................ H05K 7/1487

* cited by examiner

*Primary Examiner* — James Wu
(74) *Attorney, Agent, or Firm* — Winston Hsu

(57) ABSTRACT

A plug-in holder includes a frame, a first engaging structure and at least one second engaging structure. The frame has a first side and a second side, wherein the first side is opposite to the second side. The first engaging structure is located at the first side. The at least one second engaging structure is located at the second side.

17 Claims, 6 Drawing Sheets

PLUG-IN HOLDER, PLUG-IN MODULE AND ELECTRONIC DEVICE

BACKGROUND OF THE DISCLOSURE

1. Field of the Disclosure

The disclosure relates to a plug-in holder and, more particularly, to a plug-in holder for installing a plug-in card on a circuit board and a plug-in module and an electronic device equipped with the plug-in holder.

2. Description of the Prior Art

M.2 is an interface standard for expansion cards and related connectors inside an electronic device. To make the electronic device meet various functional requirements, a circuit board of the electronic device usually has a plurality of slots for installing M.2 module cards with different functions. In general, the M.2 module card is inserted into the corresponding slot in a direction parallel to the circuit board. When the size of the M.2 module card is large, the M.2 module card will occupy large area above the circuit board. Thus, it is not beneficial for layout of the circuit board and arrangement of electronic components.

SUMMARY OF THE DISCLOSURE

The disclosure provides a plug-in holder for installing a plug-in card into a circuit board and a plug-in module and an electronic device equipped with the plug-in holder, so as to solve the aforesaid problems.

According to an embodiment of the disclosure, a plug-in module comprises a circuit board and a plug-in holder. The circuit board has at least one engaging hole. The plug-in holder comprises a frame, a first engaging structure and at least one second engaging structure. The frame has a first side and a second side, wherein the first side is opposite to the second side. The first engaging structure is located at the first side. The at least one second engaging structure is located at the second side. The plug-in holder is installed on the circuit board and the at least one second engaging structure engages with the at least one engaging hole.

According to another embodiment of the disclosure, an electronic device comprises a casing, a circuit board, a plug-in card and a plug-in holder. The circuit board is disposed in the casing and the circuit board has at least one engaging hole. The plug-in card has an engaging recess. The plug-in holder comprises a frame, a first engaging structure and at least one second engaging structure. The frame has a first side and a second side, wherein the first side is opposite to the second side. The first engaging structure is located at the first side. The at least one second engaging structure is located at the second side. The plug-in card is disposed on the frame and the first engaging structure engages with the engaging recess. The plug-in holder installs the plug-in card on the circuit board and the at least one second engaging structure engages with the at least one engaging hole.

According to another embodiment of the disclosure, a plug-in holder comprises a frame, a first engaging structure and at least one second engaging structure. The frame has a first side and a second side, wherein the first side is opposite to the second side. The first engaging structure is located at the first side. The at least one second engaging structure is located at the second side.

As mentioned in the above, a user may dispose the plug-in card (e.g. M.2 module card) on the frame of the plug-in holder and then utilize the plug-in holder to install the plug-in card on the circuit board. When the plug-in card is disposed on the frame of the plug-in holder, the first engaging structure engages with the plug-in card to restrain the plug-in card on the frame. Then, when the plug-in holder installs the plug-in card on the circuit board, the second engaging structure of the frame engages with the circuit board, such that the plug-in holder stably holds the plug-in card on the circuit board. The plug-in card may be vertically installed on the circuit board by the plug-in holder. Accordingly, the disclosure can effectively reduce the area of the circuit board occupied by the plug-in card, such that it is beneficial for layout of the circuit board and arrangement of electronic components.

These and other objectives of the present disclosure will no doubt become obvious to those of ordinary skill in the art after reading the following detailed description of the preferred embodiment that is illustrated in the various figures and drawings.

DETAILED DESCRIPTION

Figure 1:
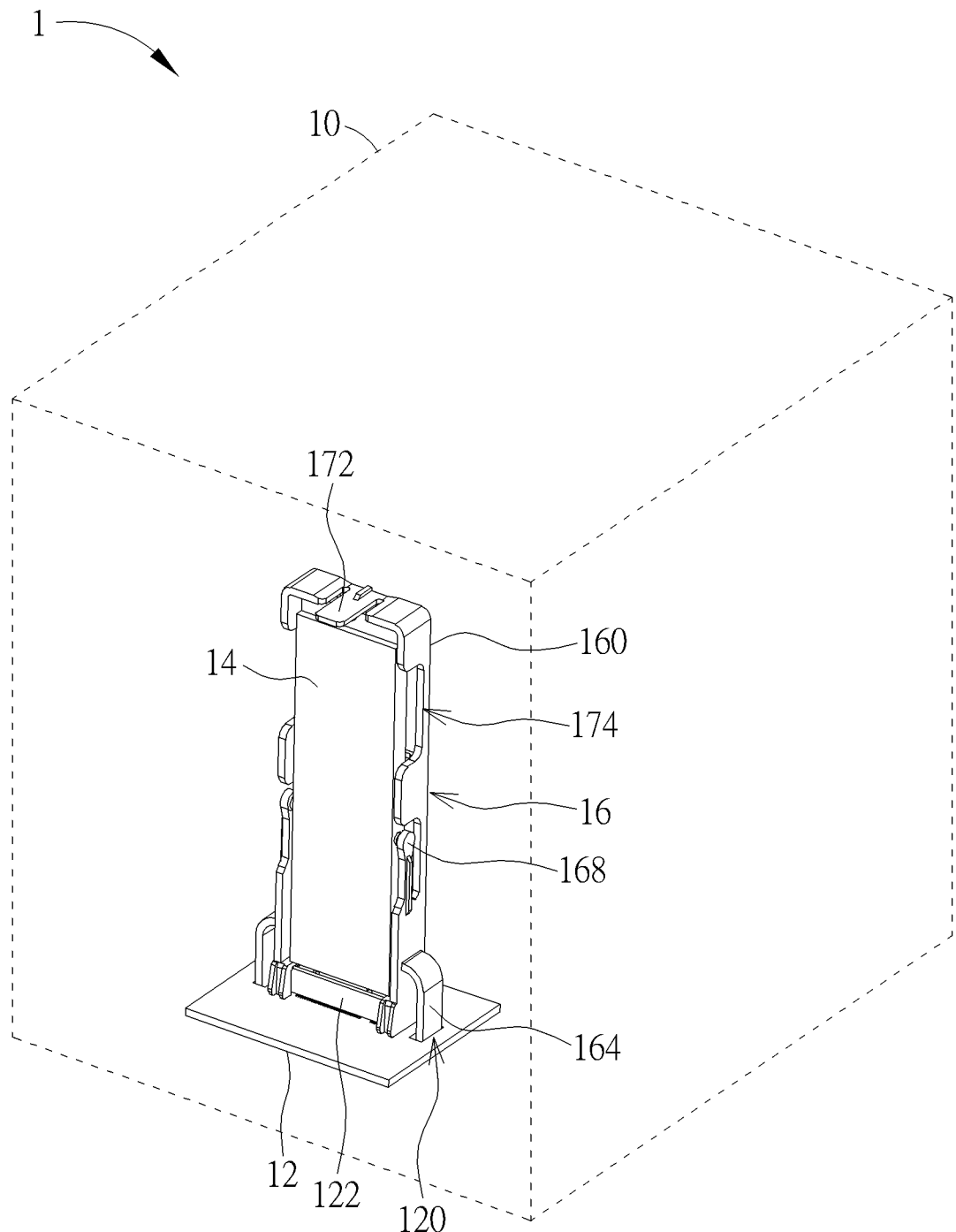
FIG. 1 is a schematic view illustrating an electronic device according to an embodiment of the disclosure.
Figure 2:
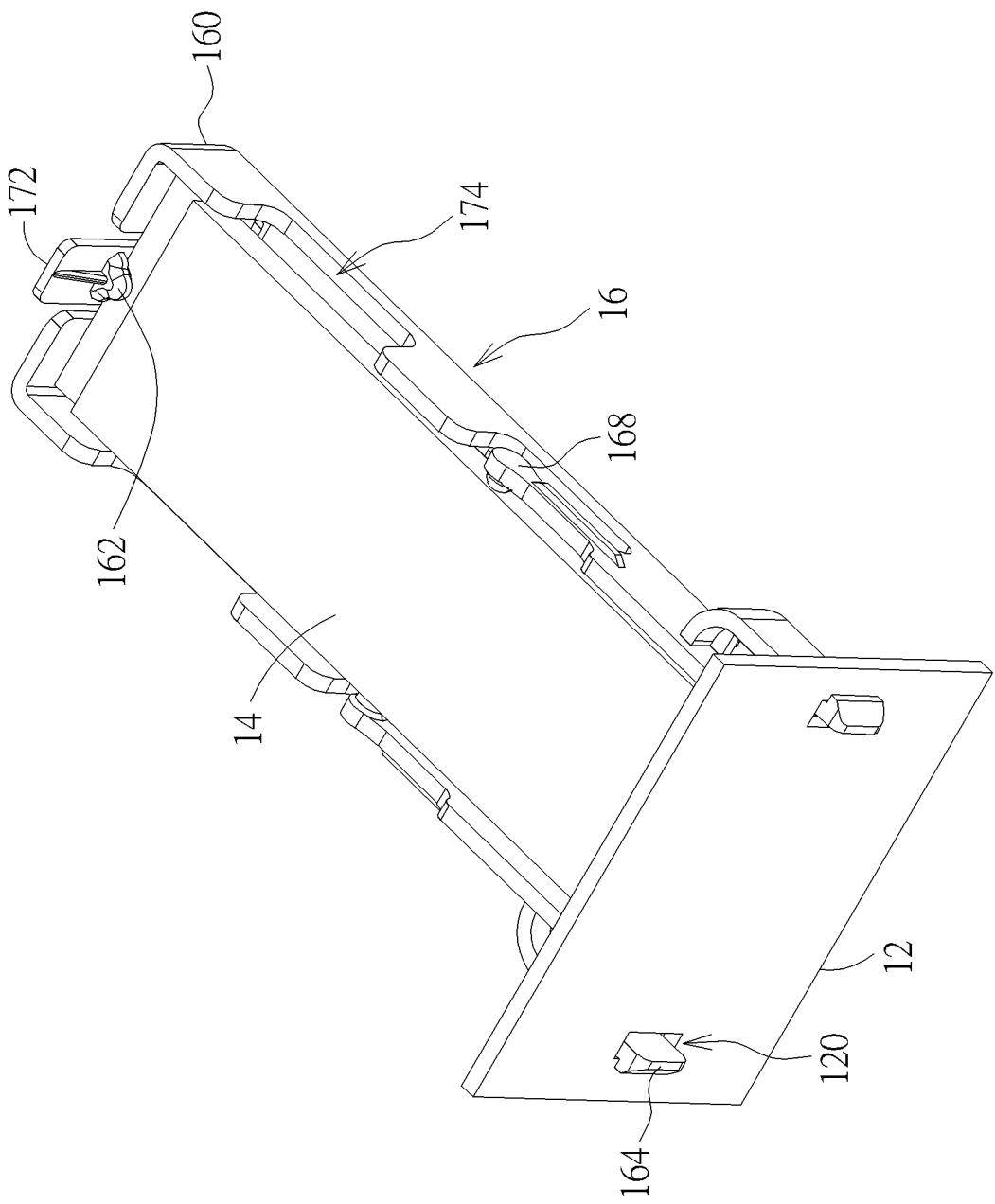
FIG. 2 is a perspective view illustrating a circuit board, a plug-in card and a plug-in holder shown in FIG. 1 from another viewing angle.
Figure 3:
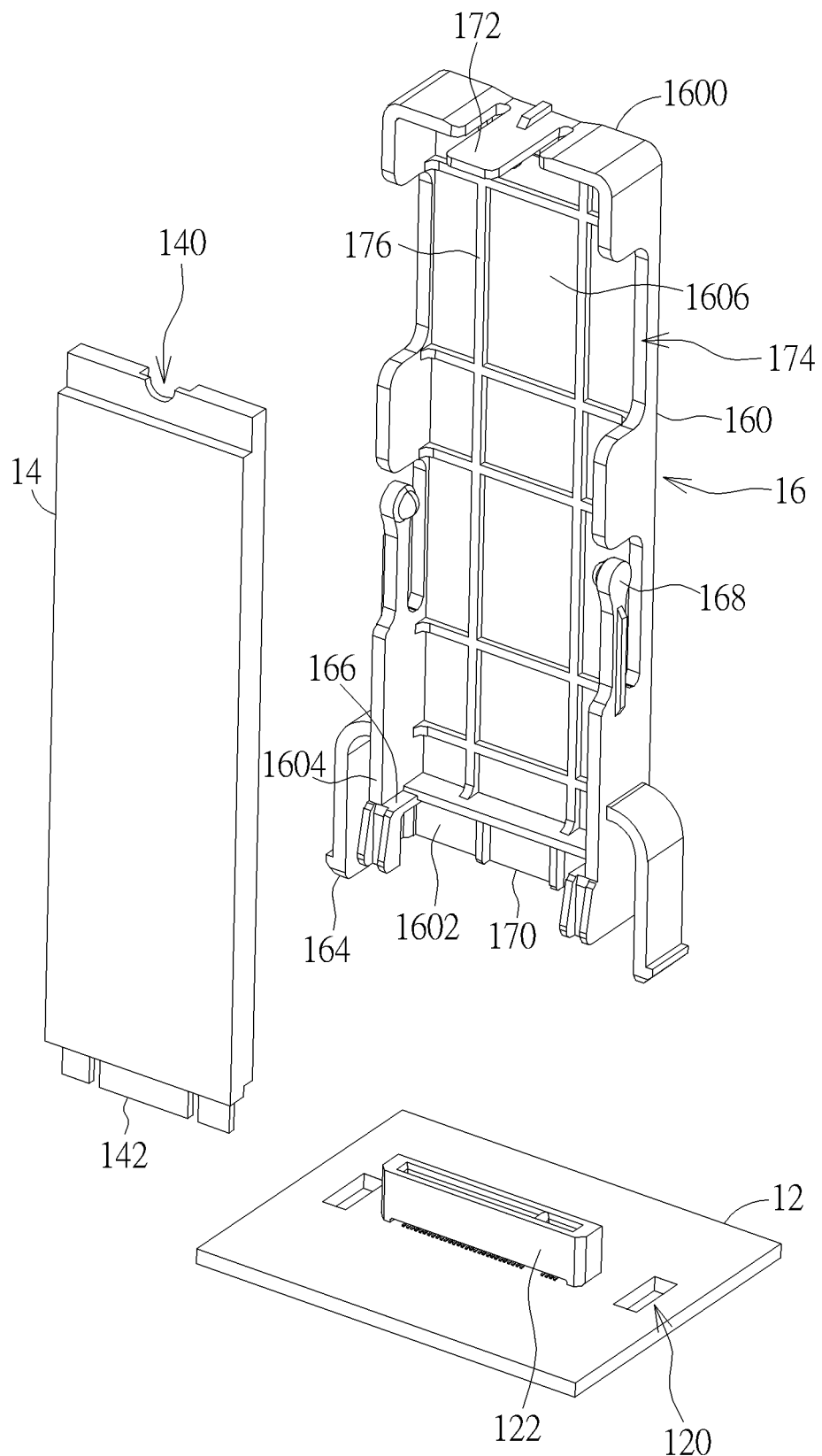
FIG. 3 is an exploded view illustrating the circuit board, the plug-in card and the plug-in holder shown in FIG. 1.
Figure 4:
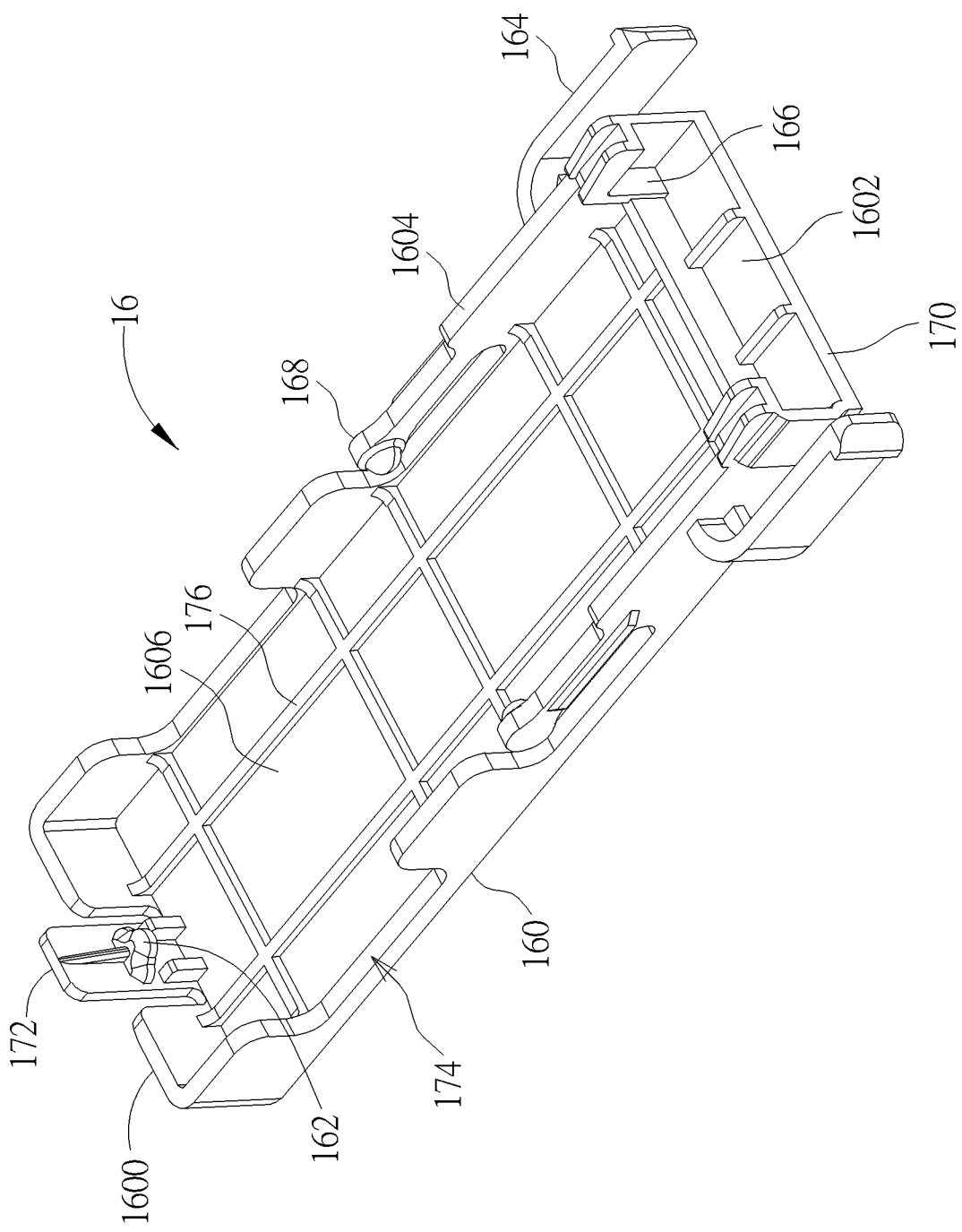
FIG. 4 is a perspective view illustrating the plug-in holder shown in FIG. 3 from another viewing angle.
Figure 5:
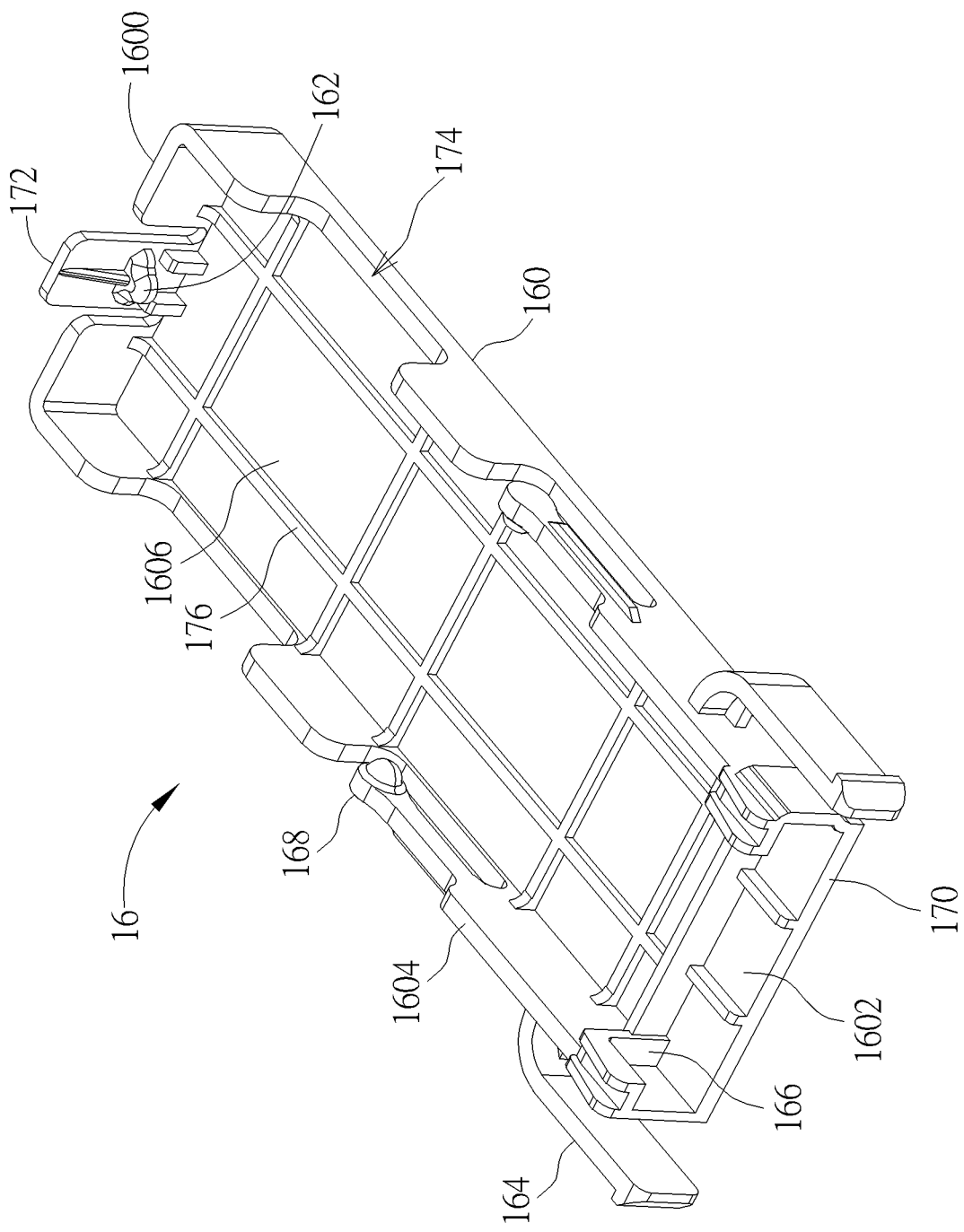
FIG. 5 is a perspective view illustrating the plug-in holder shown in FIG. 3 from another viewing angle.
Figure 6:
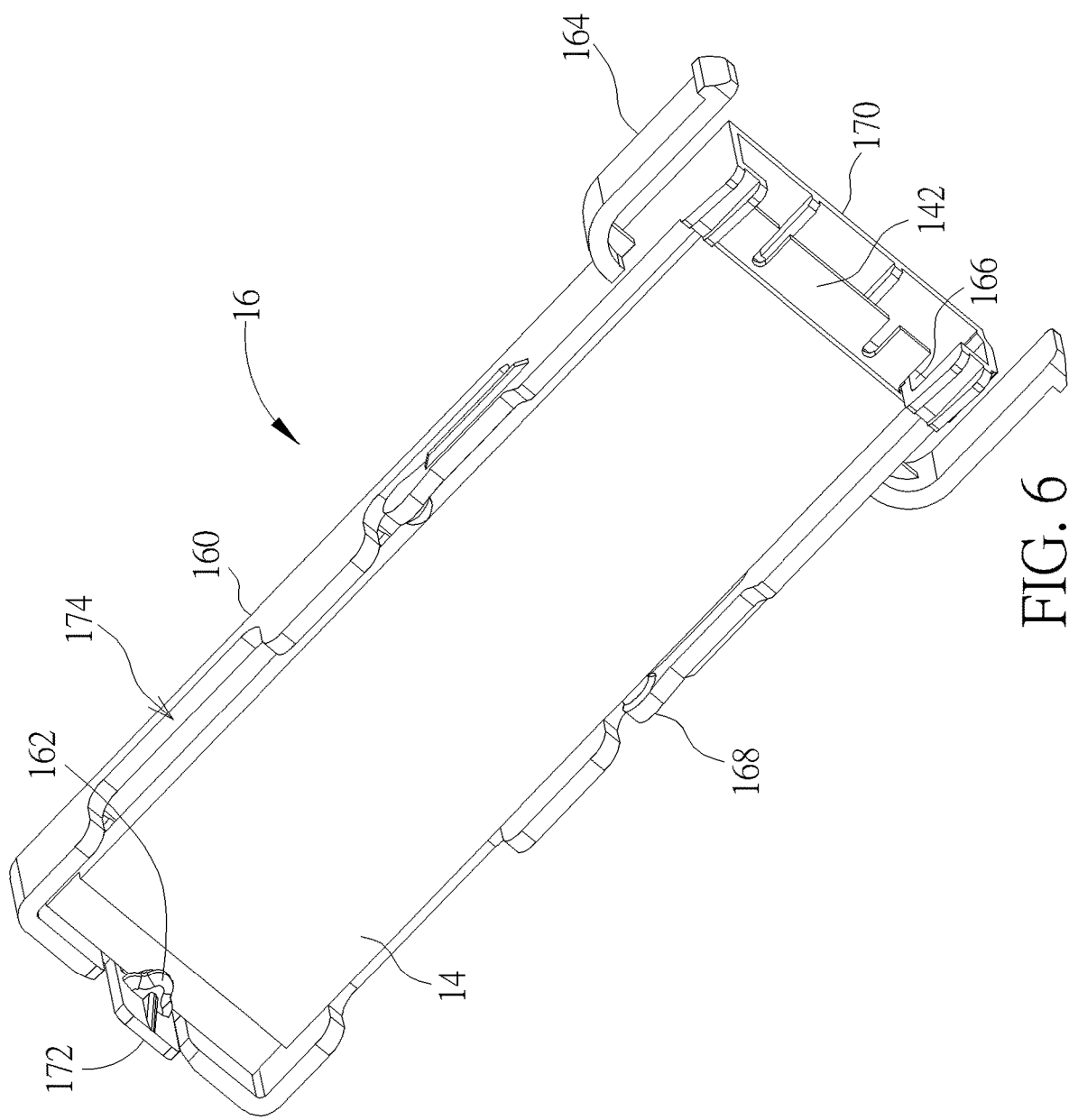
FIG. 6 is a perspective view illustrating the plug-in card shown in FIG. 3 being disposed on a frame of the plug-in holder.

Referring to FIGS. 1 to 6, FIG. 1 is a schematic view illustrating an electronic device 1 according to an embodiment of the disclosure, FIG. 2 is a perspective view illustrating a circuit board 12, a plug-in card 14 and a plug-in holder 16 shown in FIG. 1 from another viewing angle, FIG. 3 is an exploded view illustrating the circuit board 12, the plug-in card 14 and the plug-in holder 16 shown in FIG. 1, FIG. 4 is a perspective view illustrating the plug-in holder 16 shown in FIG. 3 from another viewing angle, FIG. 5 is a perspective view illustrating the plug-in holder 16 shown in FIG. 3 from another viewing angle, and FIG. 6 is a perspective view illustrating the plug-in card 14 shown in FIG. 3 being disposed on a frame 160 of the plug-in holder 16.

As shown in FIGS. 1 to 6, an electronic device 1 comprises a casing 10, a circuit board 12, a plug-in card 14 and a plug-in holder 16. A plug-in module of the disclosure may essentially consist of the circuit board 12 and the plug-in holder 16. The electronic device 1 may be a computer, a server, or other electronic devices equipped with the circuit board 12, the plug-in card 14 and the plug-in holder 16 according to practical applications. In general, the electronic device 1 may be further equipped with some necessary hardware and/or software components for specific purposes, such as processor, memory, power supply, applications, communication module, etc., and it depends on practical applications. Furthermore, the casing 10 shown in FIG. 1 is illustrated by dotted line and the appearance of the casing 10 may be designed according to practical applications.

The circuit board 12 is disposed in the casing 10 and the circuit board 12 has at least one engaging hole 120 and a first electrical connector 122. In this embodiment, the circuit board 12 may have two engaging holes 120 and the first electrical connector 122 is located between the two engaging holes 120. In this embodiment, the first electrical connector 122 may be a slot connector and an opening of the first electrical connector 122 is orientated in a direction perpendicular to the circuit board 12. It should be noted that the size of the circuit board 12 may be determined according to practical applications, so the disclosure is not limited to the embodiment shown in the figures.

The plug-in card 14 has an engaging recess 140 and a second electrical connector 142, wherein the second electrical connector 142 and the engaging recess 140 are located at opposite ends of the plug-in card 14. In this embodiment, the second electrical connector 142 may be a card edge connector. Thus, the second electrical connector 142 of the plug-in card 14 may be vertically inserted into the first electrical connector 122 of the circuit board 12, such that the second electrical connector 142 is electrically connected to the first electrical connector 122. In this embodiment, the plug-in card 14 may be, but not limited to, an M.2 module card. In another embodiment, the plug-in card 14 may also be other module cards capable of being installed on the circuit board 12.

The plug-in holder 16 is used to install the plug-in card 14 on the circuit board 12. In this embodiment, the plug-in holder 16 may install the plug-in card 14 vertically on the circuit board 12, but the disclosure is not so limited. The plug-in holder 16 comprises a frame 160, a first engaging structure 162, at least one second engaging structure 164, at least one retaining structure 166, at least one clamping structure 168, a support structure 170, an extending structure 172, at least one recess structure 174 and a reinforcing structure 176.

The frame 160 has a first side 1600 and a second side 1602, wherein the first side 1600 is opposite to the second side 1602. The first engaging structure 162 is located at the first side 1600 of the frame 160 and the extending structure 172 extends from the first engaging structure 162 in a direction away from the frame 160. In this embodiment, the first engaging structure 162 may be an elastic hook extending from the first side 1600 of the frame 160. A user may pull the extending structure 172 outward to make the first engaging structure 162 deform elastically. The at least one second engaging structure 164 and the at least one retaining structure 166 are located at the second side 1602 of the frame 160. The second side 1602 of the frame 160 may have at least one side wall 1604, wherein the at least one second engaging structure 164 is located at an outside of the at least one side wall 1604, and the at least one retaining structure 166 is located at an inside of the at least one side wall 1604. In this embodiment, the plug-in holder 16 may comprise two second engaging structures 164 and two retaining structures 166, and the second side 1602 of the frame 160 may have two side walls 1604, wherein the two second engaging structures 164 and the two retaining structures 166 are located at opposite sides of the second side 1602 of the frame 160 respectively, the two second engaging structures 164 are located at the outside of the two side walls 1604, and the two retaining structures 166 are located at the inside of the two side walls 1604. In this embodiment, the second engaging structure 164 may be an elastic hook extending from the outside of the side wall 1604, and the retaining structure 166 may be a retaining wall extending from the inside of the side wall 1604. The user may press the second engaging structure 164 to make the second engaging structure 164 deform elastically.

The support structure 170 is located at the second side 1602 of the frame 160. In this embodiment, the support structure 170 may be a U-shaped structure on the bottom of the second side 1602 of the frame 160. In another embodiment, the support structure 170 may also be strip-shaped, L-shaped or other shapes according to practical applications. The at least one clamping structure 168 and the at least one recess structure 174 are located at at least one side of the frame 160. In this embodiment, the plug-in holder 16 may comprise two clamping structures 168 and two recess structures 174, wherein the two clamping structures 168 and the two recess structures 174 are located at opposite sides of the frame 160 respectively. In this embodiment, the clamping structure 168 may an elastic protrusion. When the clamping structure 168 is pushed, the clamping structure 168 deforms elastically. The reinforcing structure 176 is located at an inner surface 1606 of the frame 160. In this embodiment, the reinforcing structure 176 may essentially consist of a plurality of ribs intersecting with each other, but the disclosure is not so limited. The reinforcing structure 176 is used to reinforce the overall strength of the plug-in holder 16. The type and arrangement of the reinforcing structure 176 may be determined according to practical applications, so the disclosure is not limited to the embodiment shown in the figures.

When the user wants to use the plug-in holder 16 to install the plug-in card 14 on the circuit board 12, the user may dispose the plug-in card 14 on the frame 160 of the plug-in holder 16 first, as shown in FIG. 6. When the plug-in card 14 is disposed on the frame 160 of the plug-in holder 16, the first engaging structure 162 engages with the engaging recess 140 on one end of the plug-in card 14, the other end of the plug-in card 14 abuts against the two retaining structures 166, and the two clamping structures 168 clamp opposite sides of the plug-in card 14. Accordingly, the plug-in card 14 is restrained on the frame 160 of the plug-in holder 16. At this time, opposite sides of the plug-in card 14 are partially exposed within the two recess structures 174, and the back of the plug-in card 14 abuts against the reinforcing structure 176.

Then, the user may insert the two second engaging structures 164 of the plug-in holder 16 into the two engaging holes 120 of the circuit board 12 and insert the second electrical connector 142 of the plug-in card 14 into the first electrical connector 122 of the circuit board 12, such that the two second engaging structures 164 engage with the two engaging holes 120 and the second electrical connector 142 is electrically connected to the first electrical connector 122. At this time, the support structure 170 of the plug-in holder 16 abuts against the circuit board 12, such that the plug-in holder 16 stably stands on the circuit board 12. Accordingly, the plug-in holder 16 can install the plug-in card 14 vertically on the circuit board 12. Since the plug-in card 14 is installed vertically on the circuit board 12, the second electrical connector 142 of the plug-in card 14 is connected to the first electrical connector 122 in a direction perpendicular to the circuit board 12. It should be noted that the plug-in holder 16 may also install the plug-in card 14 horizontally on the circuit board 12 according to practical applications.

When the user wants to detach the plug-in card 14, the user may press the two second engaging structures 164 to make the two second engaging structures 164 deform elastically. Then, the user may pull the plug-in holder 16 upward, such that the second electrical connector 142 of the plug-in card 14 is separated from the first electrical connector 122 of the circuit board 12. Then, the user may use two fingers of one hand to grab opposite sides of the plug-in card 14 through the two recess structures 174 and use one finger of the other hand to pull the extending structure 172 outward, so as to disengage the first engaging structure 162 from the engaging recess 140 of the plug-in card 14. Then, the user may detach the plug-in card 14 from the plug-in holder 16.

As mentioned in the above, a user may dispose the plug-in card (e.g. M.2 module card) on the frame of the plug-in holder and then utilize the plug-in holder to install the plug-in card on the circuit board. When the plug-in card is disposed on the frame of the plug-in holder, the first engaging structure engages with the plug-in card to restrain the plug-in card on the frame. Then, when the plug-in holder installs the plug-in card on the circuit board, the second engaging structure of the frame engages with the circuit board, such that the plug-in holder stably holds the plug-in card on the circuit board. The plug-in card may be vertically installed on the circuit board by the plug-in holder. Accordingly, the disclosure can effectively reduce the area of the circuit board occupied by the plug-in card, such that it is beneficial for layout of the circuit board and arrangement of electronic components.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A plug-in module comprising:
a circuit board having at least one engaging hole; and
a plug-in holder comprising:
a frame having a first side and a second side, the first side being opposite to the second side;
a first engaging structure located at the first side, the first engaging structure being an elastic hook extending from the first side of the frame;
at least one second engaging structure located at the second side, the at least one second engaging structure being an elastic hook; and
at least one retaining structure fixedly located at the second side;
wherein the second side has at least one side wall, the at least one second engaging structure is located at an outside of the at least one side wall, and the at least one retaining structure is located at an inside of the at least one side wall;
wherein the plug-in holder is installed on the circuit board and the at least one second engaging structure is inserted into the at least one engaging hole;
wherein the at least one retaining structure is located within the frame and configured to retain a plug-in card on the frame.

2. The plug-in module of claim 1, wherein the plug-in holder further comprises at least one clamping structure located at at least one side of the frame.

3. The plug-in module of claim 1, wherein the plug-in holder further comprises a support structure located at the second side and the support structure abuts against the circuit board.

4. The plug-in module of claim 1, wherein the plug-in holder further comprises an extending structure extending from the first engaging structure in a direction away from the frame.

5. The plug-in module of claim 1, wherein the plug-in holder further comprises at least one recess structure located at at least one side of the frame.

6. The plug-in module of claim 1, wherein the plug-in holder further comprises a reinforcing structure located at an inner surface of the frame.

7. The plug-in module of claim 1, wherein the plug-in holder further comprises a support structure, an extending structure and at least one recess structure, the support structure is located at the second side and abuts against the circuit board, the extending structure extends from the first engaging structure in a direction away from the frame, and the at least one recess structure is located at at least one side of the frame.

8. An electronic device comprising:
a casing;
a circuit board disposed in the casing, the circuit board having at least one engaging hole;
a plug-in card having an engaging recess; and
a plug-in holder comprising:
a frame having a first side and a second side, the first side being opposite to the second side;
a first engaging structure located at the first side, the first engaging structure being an elastic hook extending from the first side of the frame;
at least one second engaging structure located at the second side, the at least one second engaging structure being an elastic hook; and
at least one retaining structure fixedly located at the second side;
wherein the second side has at least one side wall, the at least one second engaging structure is located at an outside of the at least one side wall, and the at least one retaining structure is located at an inside of the at least one side wall;
wherein the plug-in card is disposed on the frame and the first engaging structure engages with the engaging recess; the plug-in holder installs the plug-in card on the circuit board and the at least one second engaging structure is inserted into the at least one engaging hole;
wherein the at least one retaining structure is located within the frame and configured to retain the plug-in card on the frame.

9. The electronic device of claim 8, wherein the plug-in holder further comprises:
at least one clamping structure located at at least one side of the frame;
a support structure located at the second side;
an extending structure extending from the first engaging structure in a direction away from the frame; and
at least one recess structure located at at least one side of the frame;
wherein the plug-in card abuts against the at least one retaining structure, the at least one clamping structure clamps the plug-in card, at least one side of the plug-in card is partially exposed within the at least one recess structure, and the support structure abuts against the circuit board.

10. The electronic device of claim 8, wherein the plug-in card is an M.2 module card, the circuit board further has a first electrical connector, the plug-in card further has a second electrical connector, the plug-in holder installs the plug-in card vertically on the circuit board, and the second electrical connector is connected to the first electrical connector in a direction perpendicular to the circuit board.

11. A plug-in holder comprising:
a frame having a first side and a second side, the first side being opposite to the second side;
a first engaging structure located at the first side, the first engaging structure being an elastic hook extending from the first side of the frame;
at least one second engaging structure located at the second side, the at least one second engaging structure being an elastic hook;
at least one retaining structure fixedly located at the second side;
wherein the second side has at least one side wall, the at least one second engaging structure is located at an outside of the at least one side wall, and the at least one retaining structure is located at an inside of the at least one side wall;
wherein the at least one retaining structure is located within the frame and configured to retain a plug-in card on the frame.

12. The plug-in holder of claim 11, further comprising at least one clamping structure located at at least one side of the frame.

13. The plug-in holder of claim 11, further comprising a support structure located at the second side.

14. The plug-in holder of claim 11, further comprising an extending structure extending from the first engaging structure in a direction away from the frame.

15. The plug-in holder of claim 11, further comprising at least one recess structure located at at least one side of the frame.

16. The plug-in holder of claim 11, further comprising a reinforcing structure located at an inner surface of the frame.

17. The plug-in holder of claim 11, wherein the plug-in holder further comprises a support structure, an extending structure and at least one recess structure, the support structure is located at the second side and abuts against the circuit board, the extending structure extends from the first engaging structure in a direction away from the frame, and the at least one recess structure is located at at least one side of the frame.

* * * * *